United States Patent
Kosakai et al.

(10) Patent No.: US 11,551,962 B2
(45) Date of Patent: Jan. 10, 2023

(54) CERAMIC SUBSTRATE AND SUSCEPTOR

(71) Applicant: SUMITOMO OSAKA CEMENT CO., LTD., Tokyo (JP)

(72) Inventors: Mamoru Kosakai, Tokyo (JP); Nobuhiro Hidaka, Tokyo (JP); Naoto Kimura, Tokyo (JP); Hironori Kugimoto, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 20 days.

(21) Appl. No.: 17/041,905

(22) PCT Filed: Mar. 28, 2019

(86) PCT No.: PCT/JP2019/013652
§ 371 (c)(1),
(2) Date: Sep. 25, 2020

(87) PCT Pub. No.: WO2019/189600
PCT Pub. Date: Oct. 3, 2019

(65) Prior Publication Data
US 2021/0013081 A1  Jan. 14, 2021

(30) Foreign Application Priority Data
Mar. 30, 2018  (JP) .............................. JP2018-066504

(51) Int. Cl.
| H01L 21/683 | (2006.01) |
| C04B 35/117 | (2006.01) |
| H02N 13/00 | (2006.01) |

(52) U.S. Cl.
CPC ........ *H01L 21/6833* (2013.01); *C04B 35/117* (2013.01); *H01L 21/683* (2013.01); *H01L 21/6835* (2013.01); *H02N 13/00* (2013.01)

(58) Field of Classification Search
CPC ............... H01L 21/683; H01L 21/6833; H01L 21/6835; H01L 21/687; H01L 21/68757;
(Continued)

(56) References Cited

U.S. PATENT DOCUMENTS

2003/0123213 A1  7/2003  Kosakai
2003/0162483 A1  8/2003  Saka et al.
(Continued)

FOREIGN PATENT DOCUMENTS

| JP | 2003-152065 A | 5/2003 |
| JP | 2014-027207 A | 2/2014 |
(Continued)

OTHER PUBLICATIONS

Office Action for Japanese Patent Application No. 2020-510993 (dated Mar. 16, 2021).
(Continued)

*Primary Examiner* — Danny Nguyen
(74) *Attorney, Agent, or Firm* — Merchant & Gould P.C.

(57) ABSTRACT

A ceramic substrate made of a dielectric material including silicon carbide particles, which is used as a forming material, in which the number of the silicon carbide particles per unit area on the surface of the substrate is smaller than the number of the silicon carbide particles per unit area in a cross section of the substrate.

9 Claims, 8 Drawing Sheets

(58) Field of Classification Search
CPC .............. C04B 35/117; C04B 35/505; C04B 35/62625; C04B 35/645; C04B 35/6265; C04B 2235/549; H02N 13/00; H01H 47/00; H01J 37/32724
USPC ........................................ 361/234
See application file for complete search history.

(56) References Cited

U.S. PATENT DOCUMENTS

| | | | |
|---|---|---|---|
| 2007/0217114 A1* | 9/2007 | Sasaki | H01L 21/6875 361/145 |
| 2017/0140970 A1 | 5/2017 | Boyd, Jr. et al. | |

FOREIGN PATENT DOCUMENTS

| | | |
|---|---|---|
| JP | 2017-206436 A | 11/2017 |
| WO | 02/24605 A1 | 3/2002 |

OTHER PUBLICATIONS

International Search Report for PCT/JP2019/013652 (dated Jun. 4, 2019).

* cited by examiner

CERAMIC SUBSTRATE AND SUSCEPTOR

TECHNICAL FIELD

The present invention relates to a ceramic substrate and a susceptor.

This application is a U.S. National Stage Application under 35 U.S.C. § 371 of International Patent Application No. PCT/JP2019/013652, filed on Mar. 28, 2019, which claims priority to Japanese Patent Application No. 2018-066504 filed in Japan on Mar. 30, 2018, the disclosures of all of which are hereby incorporated by reference in their entireties.

BACKGROUND

In recent years, in a semiconductor manufacturing apparatus which performs a plasma process, a susceptor has been used in which a plate-shaped sample (wafer) can be easily mounted and fixed to a sample stage and the temperature of the wafer can be maintained at a desired temperature. An electrostatic chuck device, which is one type of susceptor, is provided with an electrostatic attraction electrode that generates an electrostatic force (Coulomb's force) between a substrate having one main surface serving as a mounting surface on which a wafer is placed and the wafer placed on the mounting surface. Usually, the substrate uses a dielectric material as a forming material.

As such an electrostatic chuck device, there is known a device having a configuration in which a mounting surface made of a dielectric material is processed to provide a plurality of projection shapes and a plate-shaped sample is held on the top surfaces of the projection shapes (refer to, for example, Patent Literature No. 1). In such a device, the plate-shaped sample can be cooled by causing a cooling gas to flow in the space between the projection portions, and thus the temperature of the plate-shaped sample can be controlled.

CITATION LIST

Patent Literature

[Patent Literature No. 1] Japanese Laid-open Patent Publication No. 2014-27207

SUMMARY OF INVENTION

Technical Problem

In the electrostatic chuck device as disclosed in Patent Literature No 1, the top surfaces of the projection shapes and the plate-shaped sample come into contact with each other, and the projection shapes are subjected to friction from the plate-shaped sample, whereby there is a case where fragments of the dielectric material fall off from the projection shapes. There is a case where such fragments are referred to as "particles".

If the particles adhere to the plate-shaped sample, they cause variation in etching in a plasma process or contamination in subsequent processes. Therefore, a ceramic substrate and a susceptor, in which the generation of particles is suppressed, have been desired.

The present invention has been made in view of such circumstances and has an object to provide a ceramic substrate and a susceptor, in which the generation of particles is suppressed.

Solution to Problem

In order to solve the above problems, according to a first aspect of the present invention, there is provided a ceramic substrate which is made of a dielectric material including silicon carbide particles as a forming material, in which the number of the silicon carbide particles per unit area on a surface of the substrate is smaller than the number of the silicon carbide particles per unit area in a cross section of the substrate.

A configuration may be adopted in which an average particle diameter of the silicon carbide particles is 0.2 μm or less.

According to a second aspect of the present invention, there is provided a susceptor including: the ceramic substrate described above, in which a surface of the ceramic substrate is amounting surface on which a plate-shaped sample is placed.

According to a third aspect of the present invention, there is provided an electrostatic chuck device including: an electrostatic chuck part which includes the above-described ceramic substrate as a mounting plate, a supporting plate, an electrostatic attraction electrode provided between the ceramic substrate and the supporting plate, and an insulating material layer that insulates surroundings of the electrostatic attraction electrode; a temperature adjusting base part; and an adhesive layer provided between the electrostatic chuck part and the temperature adjusting base part.

The ceramic substrate according to the above aspect may be formed by a method including: a first step of forming a plurality of projection portions by performing blasting on a base material made of a composite sintered body which includes aluminum oxide particles or yttrium oxide particles as a main phase and silicon carbide particles as a sub-phase; and a second step including at least one sub-step of the following (a) to (c), which is performed after the step of forming the projection portions.

(a) a step of heat-treating the base material at a temperature of 900° C. or higher and 1300° C. or lower in a chamber for treatment (b) a step of performing heat treatment by irradiating a surface of the base material on which the projection portions have been formed, with laser light (c) a step of acid-treating a surface of the base material on which the projection portions are formed.

Advantageous Effects of Invention

According to the present invention, it is possible to provide a ceramic substrate and a susceptor, in which the generation of particles is suppressed.

DESCRIPTION OF EMBODIMENTS

First Embodiment

Hereinafter, preferred examples of a ceramic substrate and a susceptor according to the present embodiment will be described with reference to the drawings. In all the following drawings, in order to make the drawings easy to see, all or some of the dimensions, ratios, or the like of the respective constituent elements are appropriately varied. There is a case where the number, a position, a size, a numerical value, a ratio, an amount, or the like can be changed, omitted, or added within a scope which does not depart from the present invention. In the following description, an electrostatic chuck will be described as an example of the susceptor. However, the present embodiment is not limited to this. As other examples of the susceptor, a vacuum suction chuck, suction type tweezers, a mechanical sample fixing device, or the like can be preferably given as an example.

[Electrostatic Chuck Device (Susceptor)]

Figure 1:
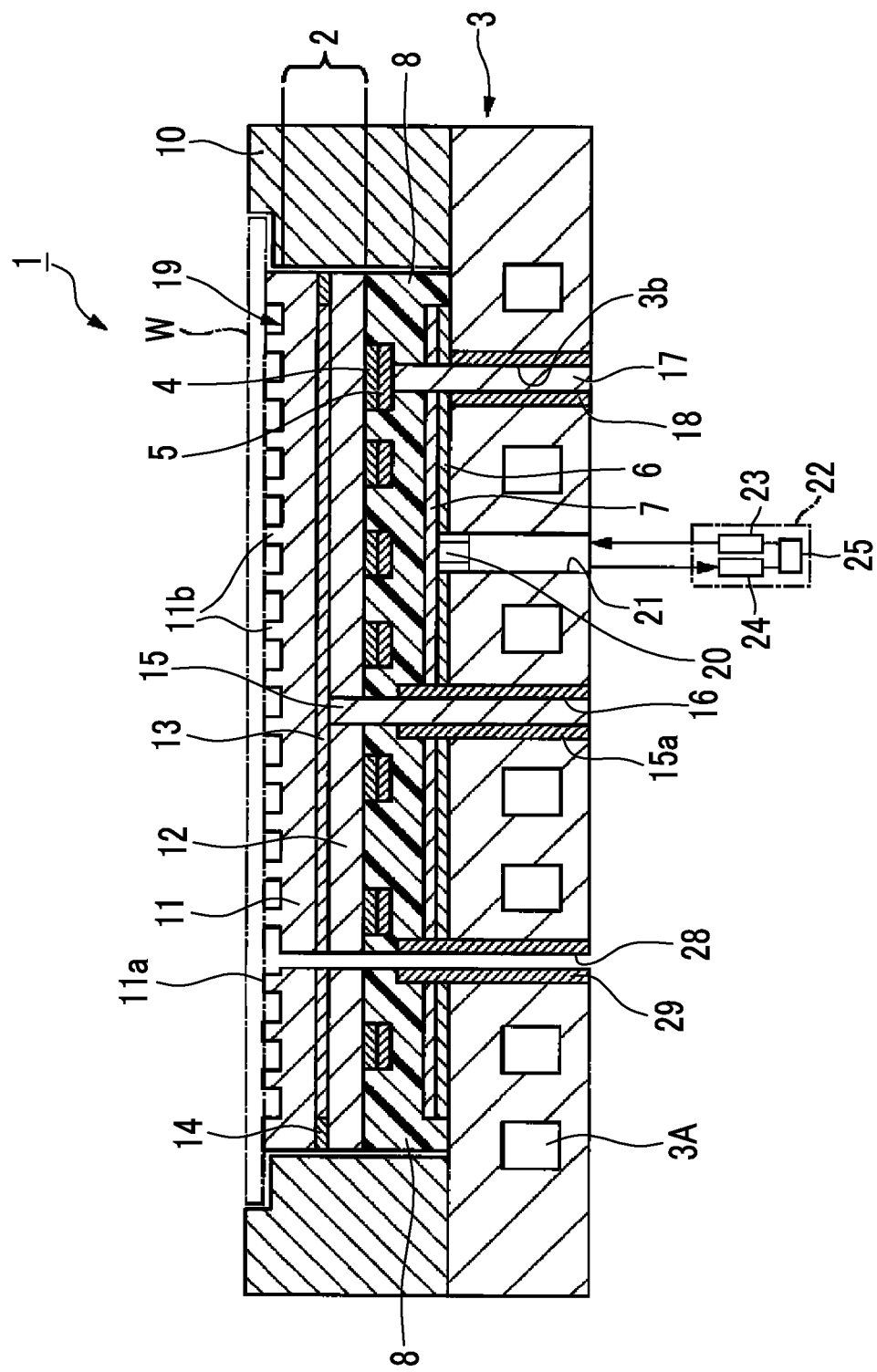
FIG. 1 is a schematic sectional view showing an electrostatic chuck device to which a ceramic substrate (mounting plate) is applied.

FIG. 1 is a sectional view showing an electrostatic chuck device to which a ceramic substrate of the present embodiment is applied.

An electrostatic chuck device 1 of the present embodiment includes an electrostatic chuck part 2 and a temperature adjusting base part 3. The electrostatic chuck part 2 has a disk shape when viewed in a plan view and has a mounting surface on the one main surface (upper surface) side. The temperature adjusting base part 3 is a member having a thick disk shape when viewed in a plan view and provided below the electrostatic chuck part 2 to adjust the electrostatic chuck part 2 to a desired temperature. Further, the electrostatic chuck part 2 and the temperature adjusting base part 3 are bonded to each other through an adhesive layer 8 provided between the electrostatic chuck part 2 and the temperature adjusting base part 3.

Hereinafter, these constituent elements will be described in order.

(Electrostatic Chuck Part)

The electrostatic chuck part 2 has a mounting plate 11 (a ceramic substrate), a supporting plate 12, an electrostatic attraction electrode 13 provided between the mounting plate 11 and the supporting plate 12, and an insulating material layer 14 which insulates the surroundings of the electrostatic attraction electrode 13. The mounting plate 11 has an upper surface serving as amounting surface 11a on which a plate-shaped sample W such as a semiconductor wafer is placed. The supporting plate 12 is integrated with the mounting plate 11 and supports the bottom portion side of the mounting plate 11. The mounting plate 11 corresponds to the "ceramic substrate" in the present invention.

The mounting plate 11 and the supporting plate 12 are disk-shaped members in which the shapes of superimposed surfaces are the same. Each of the mounting plate 11 and the supporting plate 12 is made of a ceramic sintered body (a dielectric material) having mechanical strength and durability against corrosive gas and plasma thereof.

The dielectric material that is the material for forming the mounting plate 11 and the supporting plate 12 is a composite sintered body in which conductive particles are dispersed in an insulating material. The dielectric material has aluminum oxide ($Al_2O_3$) particles and/or yttrium oxide ($Y_2O_3$) particles as the insulating material (particles) that is a main phase. Further, the dielectric material has silicon carbide (SiC) particles as the conductive particles that is a sub-phase.

In the electrostatic chuck device 1, the number of silicon carbide particles per unit area in the mounting surface 11a is smaller than the number of silicon carbide particles per unit area in any cross section of the mounting plate 11.

As long as the above characteristic is satisfied, the reduction rate of the number can be optionally selected. For example, the ratio which is represented by the expression, (the number of silicon carbide particles per unit area in the mounting surface)/(the number of silicon carbide particles per unit area in the cross section of the mounting plate), may be included in a range which is selected from the ranges of 0.01 to 0.99, 0.01 to 0.85, 0.01 to 0.70, 0.01 to 0.50, 0.01 to 0.40, or the like, as necessary. In addition, the ratio may be in the range of 0.01 to 0.10, 0.10 to 0.20, 0.20 to 0.30, 0.30 to 0.60, or the like.

The silicon carbide particles which are present on the mounting surface 11a are considered to be one type of causes of particle generation. In an electrostatic chuck device manufactured by a method of the related art, the number of silicon carbide particles per unit area is substantially the same in the surface of the mounting plate and the cross section of the mounting plate.

On the other hand, the electrostatic chuck device 1 of the present embodiment is manufactured by a method which will be described later, whereby the number of silicon carbide particles per unit area in the surface (mounting surface 11a) of the mounting plate 11 becomes smaller than the number of silicon carbide particles per unit area in the cross section of the mounting plate 11. In the electrostatic chuck device 1, it is considered that the generation of particles is suppressed.

The number of silicon carbide particles per unit area in the mounting surface 11a and the cross section of the mounting plate 11 can be measured by using a test piece obtained by cutting out a part of the mounting plate 11, and observing the mounting surface 11a and the cross section of the mounting plate with a scanning electron microscope (SEM). As the number of silicon carbide particles per unit area in the mounting surface 11a and the cross section of the mounting plate 11, the average value of the measured values obtained from 10 test pieces is adopted.

The average crystal grain size of the aluminum oxide particles and the yttrium oxide particles as the main phase of the dielectric material can be optionally selected. However, it is preferably 5 μm or less, and more preferably 2 μm or less. Further, the average crystal grain size of the aluminum oxide particles and the yttrium oxide particles is preferably 0.5 μm or more. Cracks associated with blasting propagate along the boundaries of the particles. Therefore, if the average crystal grain size of the main phase is the value described above, propagation of unintended cracks to a deep portion of the processed surface can be suppressed.

The average particle diameter of the silicon carbide particles as the sub-phase of the dielectric material can be optionally selected. However, it is preferably 0.2 μm or less, and more preferably 0.1 μm or less. Further, the average particle diameter of the silicon carbide particles is preferably 0.01 μm or more. If the average particle diameter of the sub-phase is within the range described above, it is easy to reduce the number of silicon carbide particles per unit area in the mounting surface 11a.

The average crystal grain size of the particles of the main phase can be obtained by using a test piece obtained by cutting out a part of the dielectric material (substrate) and observing the surface of the test piece with a transmission electron microscope (TEM). Specifically, the obtained electron micrograph is incorporated into image analysis type particle size distribution measurement software (Mac-View Version 4) and the major axis diameters of 200 or more crystal grains are calculated. The arithmetic average value of the obtained major axis diameters of the crystal grains is defined as an "average crystal grain size" to be obtained.

The software described above is that used for simplification of the work, and an operator may read the major axis diameters of the crystal grains from the electron micrograph without using software and calculate an average crystal grain size. In that case, when a tangent diameter using two parallel lines is obtained with respect to the crystal grain that can be confirmed in the observation visual field by the TEM, the longest tangent diameter in the crystal grain is defined as a "major axis diameter".

The average particle diameter of the particles of the sub-phase is also obtained by the same method as the method described above except that the major axis diameters of 200 or more silicon carbide particles are used.

The ratio of the aluminum oxide particles and/or yttrium oxide particles forming the main phase to the silicon carbide particles forming the sub-phase can be optionally selected. However, in general, it is in a range of 99:1 to 80:20 in a volume % ratio, and preferably, it is in a range of 97:3 to 88:12. However, there is no limitation thereto.

Further, in the mounting plate 11 and the supporting plate 12, the density (relative density) of the dielectric material that is a forming material with respect to the theoretical density is preferably 95% or more, and more preferably 97% or more. The upper limit value of the relative density is ideally 100%.

A plurality of projection portions 11b each having a diameter smaller than the thickness of the plate-shaped sample are formed at predetermined intervals on the mounting surface 11a of the mounting plate 11, and the projection portions 11b support the plate-shaped sample W.

The thickness of the entirety including the mounting plate 11, the supporting plate 12, the electrostatic attraction electrode 13, and the insulating material layer 14, that is, the thickness of the electrostatic chuck part 2 can be optionally selected. However, as an example, it is 0.7 mm or more and 5.0 mm or less.

For example, if the thickness of the electrostatic chuck part 2 falls below 0.7 mm, there is a case where it becomes difficult to secure the mechanical strength of the electrostatic chuck part 2. If the thickness of the electrostatic chuck part 2 exceeds 5.0 mm, the thermal capacity of the electrostatic chuck part 2 increases, and thus there is a case where the thermal responsiveness of the plate-shaped sample W placed thereon deteriorates. Further, due to an increase in the heat transfer in a lateral direction of the electrostatic chuck part, there is a case where it becomes difficult to maintain the in-plane temperature of the plate-shaped sample W at a desired temperature pattern. The thickness of each part described here is an example and is not limited to the range described above.

The electrostatic attraction electrode 13 is used as an electrostatic chucking electrode for generating electric charges and fixing the plate-shaped sample W with an electrostatic attraction force. The shape or size thereof is appropriately adjusted according to the use thereof.

The electrostatic attraction electrode 13 is formed of a material which is optionally selected. It is preferable that the electrode is formed of conductive ceramics such as an aluminum oxide-tantalum carbide ($Al_2O_3$—$Ta_4C_5$) conductive composite sintered body, an aluminum oxide-tungsten ($Al_2O_3$—W) conductive composite sintered body, an aluminum oxide-silicon carbide ($Al_2O_3$—SiC) conductive composite sintered body, an aluminum nitride-tungsten (AlN—W) conductive composite sintered body, an aluminum nitride-tantalum (AlN—Ta) conductive composite sintered body, or an yttrium oxide-molybdenum ($Y_2O_3$—Mo) conductive composite sintered body, or high melting point metal such as tungsten (W), tantalum (Ta), or molybdenum (Mo).

The thickness of the electrostatic attraction electrode 13 is not particularly limited. However, for example, the thickness of 0.1 μm or more and 100 μm or less can be selected, and the thickness of 5 μm or more and 20 μm or less is more preferable.

If the thickness of the electrostatic attraction electrode 13 falls below 0.1 μm, there is a case where it becomes difficult to secure sufficient electrical conductivity. If the thickness of the electrostatic attraction electrode 13 exceeds 100 μm, cracking easily occurs in the joint interfaces between the electrostatic attraction electrode 13, and the mounting plate 11 and the supporting plate 12 due to a difference in coefficient of thermal expansion between the electrostatic attraction electrode 13, and the mounting plate 11 and the supporting plate 12.

The electrostatic attraction electrode 13 having such a thickness can be easily formed by a film formation method such as a sputtering method or a vapor deposition method, or a coating method such as a screen printing method.

The insulating material layer 14 surrounds the electrostatic attraction electrode 13 to protect the electrostatic attraction electrode 13 from corrosive gas and plasma thereof, and joins and integrates a boundary portion between the mounting plate 11 and the supporting plate 12, that is, an outer peripheral portion region except for the electrostatic attraction electrode 13. The insulating material layer 14 is formed of an insulating material having the same composition or the same main component as the material configuring the mounting plate 11 and the supporting plate 12.

(Temperature Adjusting Base Part

The temperature adjusting base part 3 is for adjusting the temperature of the electrostatic chuck part 2 to a desired temperature and has a thick disk shape. As the temperature adjusting base part 3, for example, a liquid-cooling base or the like, in which a flow path 3A for circulating a refrigerant is formed in the interior thereof, is suitable.

As a material configuring the temperature adjusting base part 3, as long as it is metal which has excellent thermal conductivity, electrical conductivity, and workability, or a compound material which includes the metal, there is no particular limitation. For example, aluminum (Al), an aluminum alloy, copper (Cu), a copper alloy, stainless steel (SUS), or the like can be suitably used. It is preferable that at least the surface which is exposed to plasma, of the temperature adjusting base part 3, is subjected to alumite treatment or has an insulating film such as alumina formed thereon.

An insulating plate 7 is bonded to the upper surface side of the temperature adjusting base part 3 through an adhesion layer 6. The adhesion layer 6 is made of a sheet-shaped or film-shaped adhesive resin having heat resistance and insulation properties, such as polyimide resin, silicone resin, or epoxy resin. The adhesion layer is formed in a thickness in a range of about 5 to 100 μm, for example. The insulating plate 7 is made of a thin plate, a sheet, or a film of resin having heat resistance, such as polyimide resin, epoxy resin, or acrylic resin.

The insulating plate 7 may be an insulating ceramic plate instead of a resin sheet, or may be a thermally sprayed film having insulation properties, such as alumina.

(Focus Ring)

A focus ring 10 is a member that has a ring shape when viewed in a plan view and is placed on a peripheral portion of the temperature adjusting base part 3. The focus ring 10 is formed of, for example, a material having electrical conductivity equivalent to that of the wafer which is placed on the mounting surface. By disposing the focus ring 10, it is possible to make an electrical environment with respect to plasma substantially coincide with that in the wafer at a peripheral portion of the wafer, and thus it is possible to make it difficult for a difference or bias in plasma treatment to occur between the central portion and the peripheral portion of the wafer.

(Other Members)

A power supply terminal 15 for applying a direct-current voltage to the electrostatic attraction electrode 13 is connected to the electrostatic attraction electrode 13. The power supply terminal 15 is inserted into a through-hole 16 penetrating the temperature adjusting base part 3, the adhesive layer 8, and the supporting plate 12 in a thickness direction. An insulator 15a having insulation properties is provided on the outer periphery side of the power supply terminal 15, and the power supply terminal 15 is insulated from the temperature adjusting base part 3 made of metal, by the insulator 15a.

In the drawing, the power supply terminal 15 is shown as an integral member. However, the power supply terminal 15 may be configured by electrically connecting a plurality of members. The power supply terminal 15 is inserted into the temperature adjusting base part 3 and the supporting plate 12, which have different coefficients of thermal expansion. Therefore, it is favorable if, for example, a portion which is inserted into the temperature adjusting base part 3 and a portion which is inserted into the supporting plate 12 are made of different materials.

As the material of the portion (extraction electrode) connected to the electrostatic attraction electrode 13 and inserted into the supporting plate 12, of the power supply terminal 15, as long as it is a conductive material having excellent heat resistance, there is no particular limitation. However, a material having a coefficient of thermal expansion which is close to the coefficients of thermal expansion of the electrostatic attraction electrode 13 and the supporting plate 12 is preferable. For example, it is preferable that the portion is made of a conductive ceramic material such as $Al_2O_3$—TaC.

The portion inserted into the temperature adjusting base part 3, of the power supply terminal 15, is made of a metal material such as tungsten (W), tantalum (Ta), molybdenum (Mo), niobium (Nb), or a Kovar alloy, for example.

It is favorable if these two members are connected to each other with a silicone-based conductive adhesive having flexibility and resistance to electricity.

A heater element 5 is provided on the lower surface side of the electrostatic chuck part 2. As the heater element 5, a non-magnetic metal thin plate having a constant thickness of 0.2 mm or less, preferably about 0.1 mm can be given as an example, and the shape thereof can also be optionally selected. The heater element 5 is obtained, for example, by processing a titanium (Ti) thin plate, a tungsten (W) thin plate, a molybdenum (Mo) thin plate, or the like into a desired heater shape, for example, a shape in which a band-like conductive thin plate meanders and the entire contour is an annular shape, by a photolithography method or laser processing.

The heater element 5 may be provided by bonding a non-magnetic metal thin plate to the electrostatic chuck part 2 and then processing and forming the non-magnetic metal thin plate on the surface of the electrostatic chuck part 2. Alternatively, the heater element 5 processed and formed at a position different from the electrostatic chuck part 2 may be provided by transfer-printing it onto the surface of the electrostatic chuck part 2.

The heater element 5 is bonded and fixed to the bottom surface of the supporting plate 12 by an adhesion layer 4 which is made of a sheet-shaped or film-shaped silicone resin or acrylic resin having a uniform thickness and having heat resistance and insulation properties.

A power supply terminal 17 for supplying electric power to the heater element 5 is connected to the heater element 5. As the material configuring the power supply terminal 17, the same material as the material configuring the power supply terminal 15 described above can be used. The power supply terminal 17 is provided so as to pass through a through-hole 3b formed in the temperature adjusting base part 3. A tubular insulator 18 having insulation properties is provided on the outer periphery side of the power supply terminal 17.

Further, a temperature sensor 20 is provided on the lower surface side of the heater element 5. In the electrostatic chuck device 1 of the present embodiment, an installation hole 21 is formed so as to penetrate the temperature adjusting base part 3 and the insulating plate 7 in the thickness direction, and the temperature sensor 20 is installed at the uppermost portion of the installation hole 21. It is preferable that the temperature sensor 20 is installed at a position as close to the heater element 5 as possible. Therefore, the installation hole 21 may be formed to extend so as to protrude further toward the adhesive layer 8 side from the structure shown in the drawing such that the temperature sensor 20 and the heater element 5 are brought closer to each other.

The temperature sensor 20 is, for example, a fluorescent emission type temperature sensor in which a phosphor layer is formed on the upper surface side of a rectangular parallelepiped-shaped light transmission body made of quartz glass or the like. The temperature sensor 20 is bonded to the lower surface of the heater element 5 by a silicone resin-based adhesive or the like having translucency and heat resistance.

The phosphor layer is made of a material that generates fluorescence in response to heat input from the heater element 5. As the material for forming the phosphor layer, as long as it is a material generating fluorescence in response to heat generation, a wide variety of fluorescent materials can be selected. As the material for forming the phosphor layer, a fluorescent material to which a rare earth element having an energy level suitable for light emission is added, a semiconductor material such as AlGaAs, metal oxide such as magnesium oxide, and a mineral such as ruby or sapphire can be given as an example. The forming material can be appropriately selected from these materials and used.

The temperature sensor 20 corresponding to the heater element 5 is provided at any position which does not interfere with the power supply terminal or the like and is in a circumferential direction of the lower surface of the heater element 5.

A temperature measurement part 22 which measures the temperature of the heater element 5 from the fluorescence of the temperature sensor 20 can be optionally selected. However, the following configuration can be given as an example. The temperature measurement part 22 can be configured to include an excitation unit 23 which irradiates the phosphor layer with excitation light on the outside (the lower side) of the installation hole 21 of the temperature adjusting base part 3, a fluorescence detector 24 which detects the fluorescence emitted from the phosphor layer, and a control unit 25 which controls the excitation unit 23 and the fluorescence detector 24 and calculates the temperature of a main heater, based on the fluorescence.

Further, the electrostatic chuck device 1 has a gas hole 28 provided so as to penetrate from the temperature adjusting base part 3 to the mounting plate 11 in the thickness direction thereof. A tubular insulator 29 is provided at an inner peripheral portion of the gas hole 28.

A gas supply device (cooling means) (not shown) is connected to the gas hole 28. Cooling gas (heat transfer gas) for cooling the plate-shaped sample W is supplied from the gas supply device through the gas hole 28. The cooling gas is supplied to grooves 19 which are formed between the plurality of projection portions 11b on the upper surface of the mounting plate 11 through the gas hole, and cools the plate-shaped sample W.

Further, the electrostatic chuck device 1 has a pin insertion hole (not shown) provided so as to penetrate from the temperature adjusting base part 3 to the mounting plate 11 in the thickness direction thereof. The pin insertion hole can adopt the same configuration as that of the gas hole 28, for example. A lift pin for removal of the plate-shaped sample is inserted into the pin insertion hole.

The electrostatic chuck device 1 has the configuration as described above.

[Method of Manufacturing Electrostatic Chuck Device]

The method of manufacturing an electrostatic chuck device according to the present embodiment is a method of manufacturing an electrostatic chuck device in which it is possible to electrostatically attract the plate-shaped sample to one main surface (mounting surface) of a substrate which uses, as a forming material, the dielectric material as described above.

Specifically, the method of manufacturing an electrostatic chuck device according to the present embodiment has a step of forming a substrate having a plurality of projection portions formed on one main surface by performing blasting on a base material using a dielectric material as a forming material and then heat-treating at least the surface subjected to the blasting.

There is a case where the projection portions 11b of the electrostatic chuck device 1 are formed by performing blasting on a dielectric substrate that is a material of the substrate. The blasting is a method in which fine particles (ceramic abrasive grains) for processing are blown onto the surface of a dielectric substrate at a high speed and the dielectric substrate is excavated with energy when the fine particles collide with the dielectric substrate. There is a case where silicon carbide particles used as a forming material are present on the surface of the substrate subjected to the blasting. Further, in the substrate subjected to the blasting, there is a case where unintended cracks are formed in the interior at a portion where although the fine particles have collided, the surface has not been excavated.

When the plate-shaped sample W is placed on the mounting surface 11a of the electrostatic chuck device 1, there is a case where the projection portions 11b are subjected to friction from the plate-shaped sample W. Further, in a plasma etching apparatus having the electrostatic chuck device, the mounting plate 11 is corroded by an etching gas or electrons excited by plasma. In this way, in the mounting plate in which the silicon carbide particles or cracks are present, there is a concern that fragments of the dielectric material, so-called particles, may fall off from the projection portions 11b. Therefore, in the method of manufacturing an electrostatic chuck device according to the present embodiment, after the blasting, heat treatment is performed to reduce the silicon carbide particles on the surface of the substrate and repair the cracks.

As the method of manufacturing an electrostatic chuck device according to the present embodiment, specifically, the following manufacturing method can be adopted.

In the following example, an example is shown in which a base material using a dielectric material as a forming material is processed integrally with another member such as a supporting plate described below. However, the base material using a dielectric material as a forming material may be processed alone, or may be treated integrally with another member other than those described below.

(Electrostatic Chuck Device Manufacturing Method 1)

FIGS. 2A to 2D are process diagrams showing an example of a method of manufacturing an electrostatic chuck device according to the first embodiment.

Figure 2A:
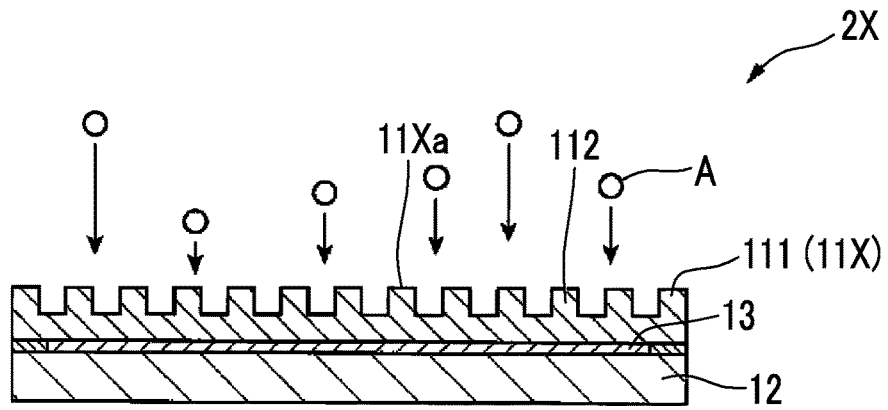
FIG. 2A is a schematic process diagram showing a method of manufacturing an electrostatic chuck device according to a first embodiment.

First, as shown in FIG. 2A, blasting is performed on an original substrate 2X to form a plurality of temporary projection portions 112 (step of forming temporary projection portions).

The original substrate 2X includes a base material 11X using a dielectric material as a forming material, a supporting plate 12 that is integrated with the base material 11X and supports the bottom portion side of the base material 11X, an electrostatic attraction electrode 13 provided between the base material 11X and the supporting plate 12, and an insulating material layer 14 that insulates the surroundings of the electrostatic attraction electrode 13. Before the blasting, a step of preparing an original substrate, in which the supporting plate, the electrostatic attraction electrode, and the insulating material layer are added to the base material, may be included. It is preferable that the base material 11X of the original substrate 2X has a flat main surface before this step. In this step, blasting is performed on the base material 11X to form the plurality of temporary projection portions 112 on one main surface of the base material 11X, thereby obtaining a temporary electrostatic chuck part 2Y.

The height of the temporary projection portion 112 in the thickness direction of the base material 11X is higher than that of the projection portion 11b to be formed. Hereinafter, the base material on which the temporary projection portions 112 are formed is referred to as a "temporary substrate 111".

In this step, ceramic abrasive grains A are blown to desired positions on one main surface of the base material 11X to form the temporary projection portions 112. At this time, a mask having openings at the desired positions can be preferably used.

At that time, there is a case where on a surface 11Xa of the base material 11X, the silicon carbide particles used as a forming material are present. Further, there is a case where in the interior of the temporary projection portion 112 or the interior on the one main surface side of the base material 11X, minute cracks are generated due to the impact by the collision of the ceramic abrasive grains A.

Figure 2B:
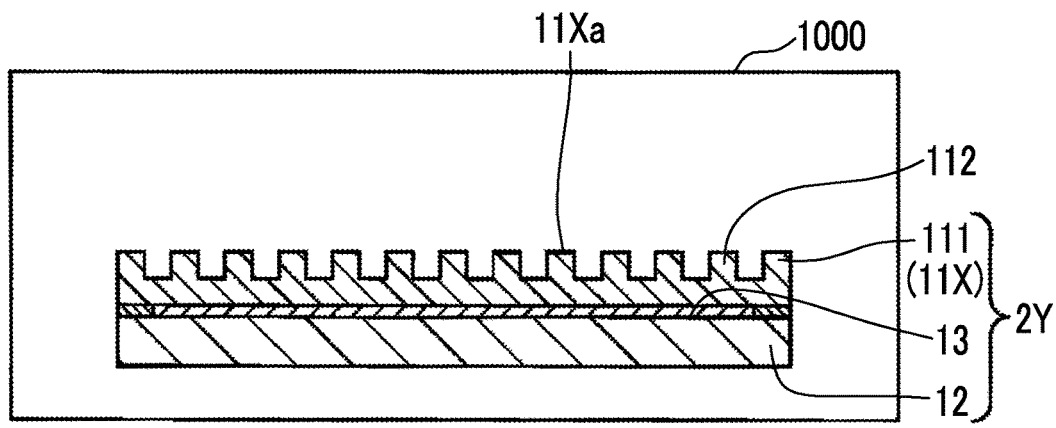
FIG. 2B is a schematic process diagram showing the method of manufacturing an electrostatic chuck device according to the first embodiment.

Subsequently, as shown in FIG. 2B, the entire temporary electrostatic chuck part 2Y is heat-treated, whereby the temporary substrate 111 is heat-treated (step of performing heat treatment).

The heat treatment of the temporary substrate 111 is performed in a temperature range of 700° C. or higher and lower than a sintering temperature of the dielectric material configuring the temporary substrate 111. The heat treatment temperature is preferably 900° C. or higher, and more preferably 1100° C. or higher. Further, the heat treatment temperature is preferably 1500° C. or lower, more preferably 1400° C. or lower, and further preferably 1300° C. or lower. It is preferable that the heat treatment of the temporary substrate 111 is performed in an inert gas or vacuum.

The upper limit value and the lower limit value can be optionally combined. For example, the heat treatment temperature is preferably 900° C. or higher and 1300° C. or lower.

The heat treatment in this step is performed, for example, by putting the temporary substrate 111 in a chamber 1000 for heat treatment and keeping the inside of the chamber 1000 at a predetermined heat treatment temperature. The atmosphere for the heat treatment of the temporary substrate 111 can be optionally selected. For example, it is preferable to perform the heat treatment in an atmosphere of an inert gas such as nitrogen or argon, or in a vacuum atmosphere. The heat treatment time can also be optionally selected and can be, for example, 30 minutes or more and 180 minutes or less. However, there is no limitation thereto. As a result of studies by the inventors, it was found that due to the heat treatment of the temporary substrate 111, the silicon carbide particles are reduced from the surface 11Xa of the base material 11X. The reason why the silicon carbide particles are reduced from the surface 11Xa is not clear. However, it is considered that it is because the average particle diameter of the silicon carbide particles is sufficiently small, so that the silicon carbide particles are easily sublimated by the heat treatment. Further, due to the treatment of this step, minute cracks generated in the blasting are repaired.

Figure 2C:
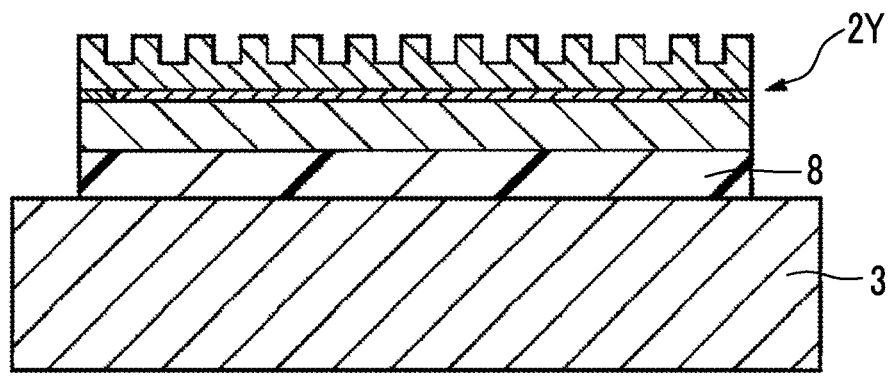
FIG. 2C is a schematic process diagram showing the method of manufacturing an electrostatic chuck device according to the first embodiment.

Subsequently, as shown in FIG. 2C, the temporary electrostatic chuck part 2Y after the heat treatment, that is, the temporary substrate 111 after the heat treatment is attached to the temperature adjusting base part 3 through the adhesive layer 8 (step of attaching the temporary substrate after the heat treatment).

Figure 2D:
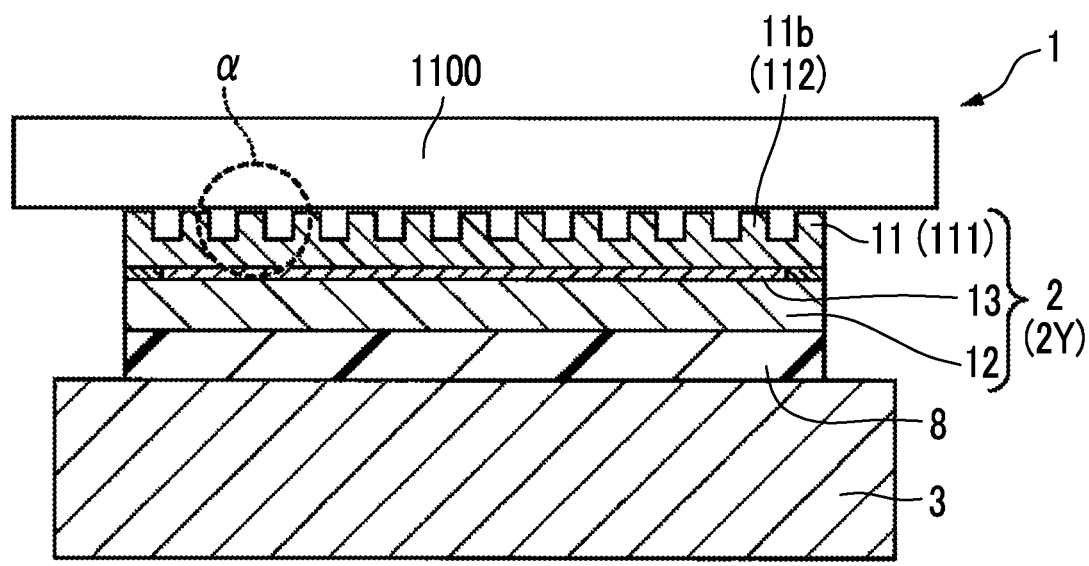
FIG. 2D is a schematic process diagram showing the method of manufacturing an electrostatic chuck device according to the first embodiment.
Figure 2E:
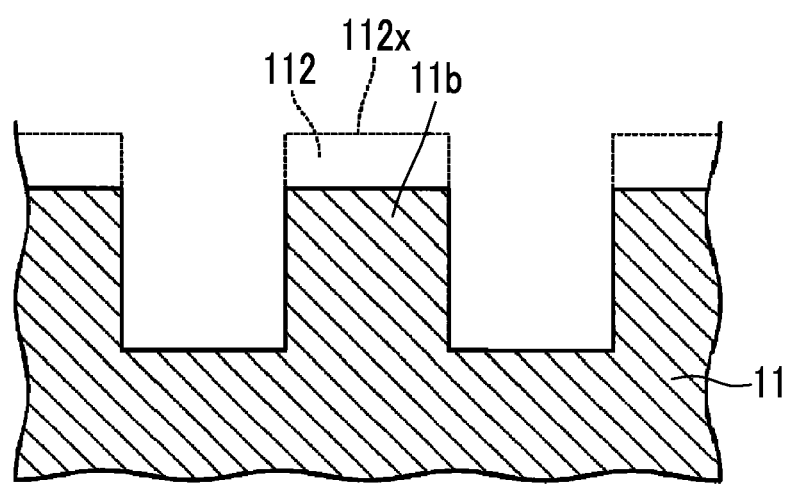
FIG. 2E is a schematic process diagram showing the method of manufacturing an electrostatic chuck device according to the first embodiment.

Subsequently, as shown in FIGS. 2D and 2E, top surfaces 112x of the plurality of temporary projection portions 112 are processed to form the plurality of projection portions 11b (step of forming projection portions). FIG. 2E is an enlarged schematic diagram of a portion indicated by reference sign a in FIG. 2D.

As described above, the temporary substrate 111 uses a dielectric material as a forming material, and the temperature adjusting base part 3 uses, as a forming material, a metal material having a coefficient of thermal expansion larger than that of the dielectric material. Therefore, if the temporary substrate 111 is attached to the temperature adjusting base part 3, there is a case where with the deformation of the temperature adjusting base part 3, the temporary substrate 111 is bent such that the temporary projection portion 112 side, which is the upper surface of the temporary substrate 111, is convex toward the temperature adjusting base part 3 side. If distortion occurs in the temporary substrate 111, there is a case where the height positions of the top surfaces 112x of the plurality of temporary projection portions 112 are not aligned.

Therefore, in a case where the height positions are not aligned, or the like, it is preferable to process the temporary projection portions 112 in this step. For example, the top surfaces 112x of the temporary projection portions 112 are ground and lapped by a single-sided lapping machine 1100 or the like to form the projection portions 11b.

As shown in FIG. 2E, the top surfaces 112x of the temporary projection portions 112 are polished, so that the projection portions 11b lower than the temporary projection portions 112 are obtained. In the plurality of projection portions 11b fabricated in this manner, the height positions of the top surfaces of the projection portions 11b are aligned.

In this way, it is possible to manufacture the electrostatic chuck device 1 in which the height positions of the top surfaces of the plurality of projection portions 11b can be aligned, and thus when supporting the plate-shaped sample W, it is possible to support the plate-shaped sample W without bending it.

According to the configuration as described above, it is possible to provide a ceramic substrate and an electrostatic chuck device, in which the generation of particles is suppressed.

Second Embodiment (Electrostatic Chuck Device Manufacturing Method 2)

Figure 3A:
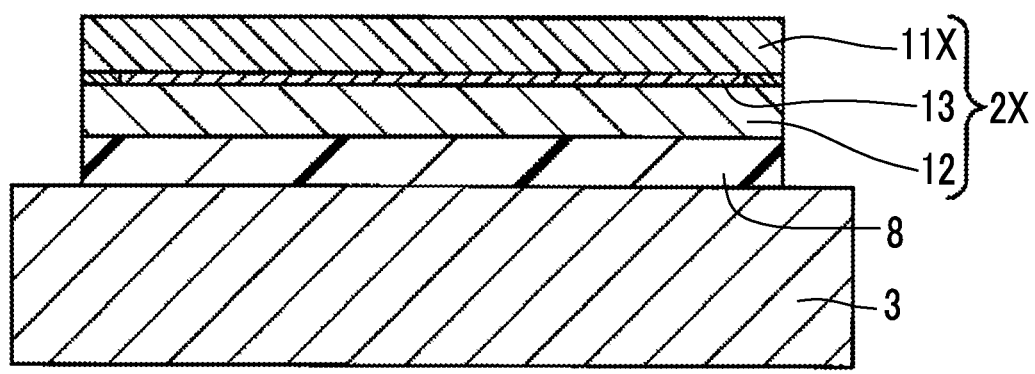
FIG. 3A is a schematic process diagram showing a method of manufacturing an electrostatic chuck device according to a second embodiment.
Figure 3B:
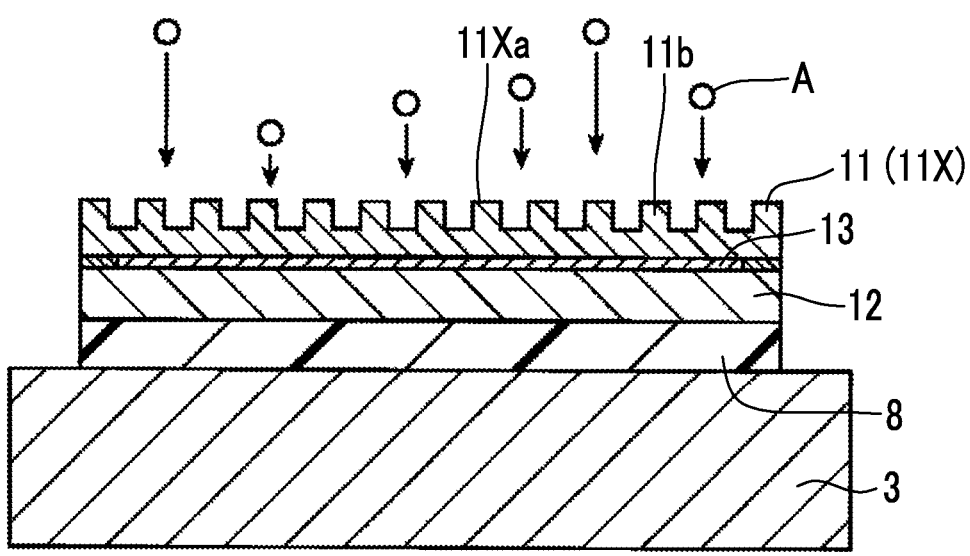
FIG. 3B is a schematic process diagram showing the method of manufacturing an electrostatic chuck device according to the second embodiment.
Figure 3C:
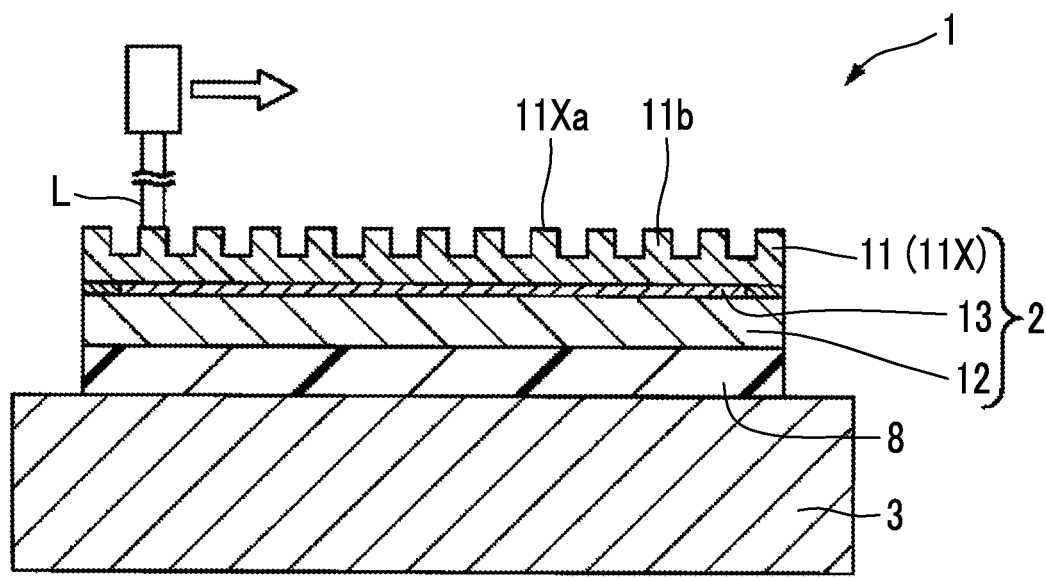
FIG. 3C is a schematic process diagram showing the method of manufacturing an electrostatic chuck device according to the second embodiment.

FIGS. 3A to 3C are process diagrams showing a method of manufacturing an electrostatic chuck device according to a second embodiment.

First, as shown in FIG. 3A, the original substrate 2X before blasting is attached to the temperature adjusting base part 3 through the adhesive layer 8 (step of attaching a base material).

The original substrate 2X includes the base material 11X that is a sintered body of a dielectric material, the supporting plate 12 that is integrated with the base material 11X and supports the bottom portion side of the base material 11X, the electrostatic attraction electrode 13 provided between the base material 11X and the supporting plate 12, and the insulating material layer 14 that insulates the surroundings of the electrostatic attraction electrode 13.

Subsequently, as shown in FIG. 3B, blasting is performed on the base material 11X to form the plurality of projection portions 11b (step of forming projection portions).

In this step, the ceramic abrasive grains A are blown onto one main surface of the base material 11X to form the projection portions 11b. At that time, there is a case where on a surface 11Xa of the base material 11X, the silicon carbide particles used as a forming material are present. Further, there is a case where minute cracks are generated in the interior of the projection portion 11b or in the interior on the one main surface side of the base material 11X due to the impact by the collision of the ceramic abrasive grains A.

Subsequently, as shown in FIG. 3C, the plurality of projection portions 11b are irradiated with laser light L to perform heat treatment (a step of performing laser light irradiation).

A method of irradiating the base material 11X with a pulse laser or an irradiation device can be optionally selected. For example, a KrF excimer laser can be used as the laser light. Further, the laser light irradiation conditions may be selected as necessary. For example, the energy density may be set to be in a range of 30 to 5500 mJ/cm2, and the irradiation time may be set to be in a range of 30 to 60 minutes.

Usually, after the base material 11X is attached to the temperature adjusting base part 3, the entire device cannot be heated to heat-treat the base material 11X. However, in the present embodiment, the heat treatment is performed by irradiating the projection portions 11b or the surface of one main surface between the projection portions 11b with the pulse laser (laser light L). The irradiation method can be optionally selected, and for example, the entire upper surface of the base material may be irradiated at the same time, or the irradiation may be performed by moving the laser in a pattern which is optionally selected. In this way, it is possible to perform heat treatment by locally heating the surface of the base material 11X which includes the projection portions 11b without heating the temperature adjusting base part 3. As a result of studies by the inventors, it was found that due to the treatment of this step, the silicon carbide particles are reduced from the surface 11Xa of the base material 11X. The reason why the silicon carbide particles are reduced from the surface 11Xa is not clear. However, it is considered that it is because the average particle diameter of the silicon carbide particles is sufficiently small, so that the silicon carbide particles are easily sublimated by the heat treatment using the laser. Further, due to the treatment of this step, the minute cracks generated in the blasting are repaired, and the mounting plate 11 is obtained.

At this time, the average crystal grain size of the sintered body configuring the base material 11X is preferably 5 μm or less, and more preferably 2 μm or less. The smaller the crystal grain size of each of the crystal grains configuring the sintered body, the more easily the silicon carbide particles are reduced from the surface 11Xa of the base material 11X by the laser light L. Further, the cracks are easily repaired by the laser light L, and the effect of this step tends to be high.

According to the configuration as described above, it is possible to provide a ceramic substrate and an electrostatic chuck device, in which the generation of particles is suppressed.

In the method of manufacturing an electrostatic chuck device according to the present embodiment, after the base material 11X which includes the projection portions 11b is attached to the temperature adjusting base part 3, the heat treatment is performed by irradiating the base material 11X with the laser light L. However, there is no limitation thereto. After the original substrate 2X is processed to form the projection portions 11b and heat treatment is performed by irradiating it with the laser light L, the obtained electrostatic chuck part 2 may be attached to the temperature adjusting base part 3.

Further, if necessary, the surface 11Xa which includes the projection portions 11b may be ground and lapped before or after the surface 11Xa of the base material 11X is irradiated with the laser light L.

Third Embodiment (Electrostatic Chuck Device Manufacturing Method 3)

In a method of manufacturing an electrostatic chuck device according to the present embodiment, after the blasting, acid treatment is performed to reduce particles.

Figure 4:
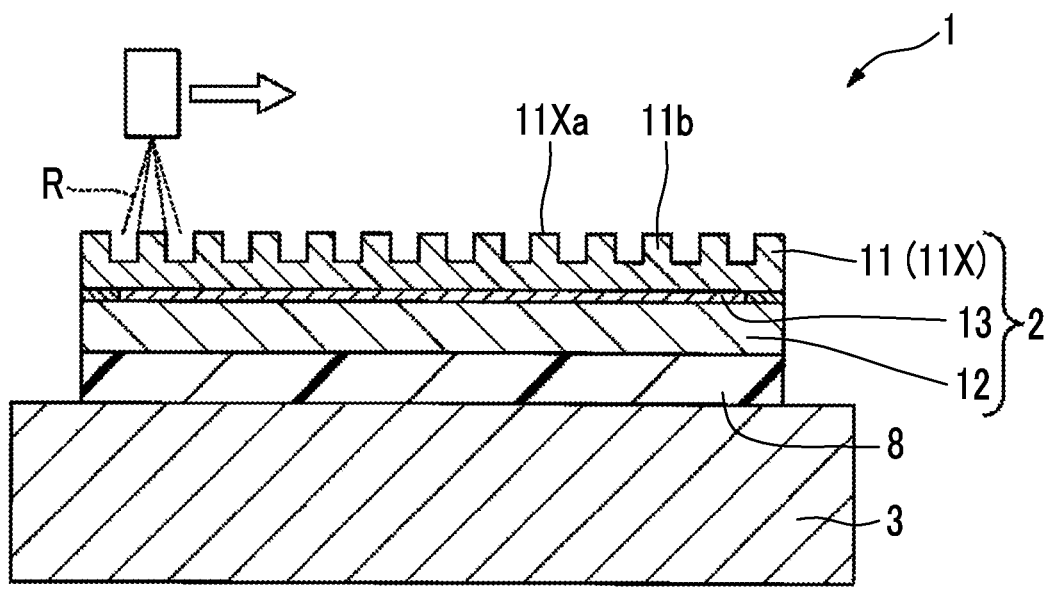
FIG. 4 is a schematic process diagram showing acid treatment in a method of manufacturing an electrostatic chuck device according to a third embodiment.

FIG. 4 is a process diagram showing acid treatment in a method of manufacturing an electrostatic chuck device according to the third embodiment. The acid treatment is performed instead of the step of performing the laser light irradiation, which is performed after the step of forming the projection portions in the second embodiment. A step of attaching the base material and a step of forming the projection portions in the present embodiment are the same as those in the first embodiment.

As shown in FIG. 4, the base material 11X on which the plurality of projection portions 11b are formed is acid-treated using an acid R. In this way, the mounting plate 11 in which the silicon carbide particles are reduced from the surface 11Xa of the base material 11X is obtained.

The acid R does not dissolve the aluminum oxide particles and the yttrium oxide particles of the main phase and dissolves the silicon carbide (SiC) particles of the sub-phase. As the type of the acid R, hydrofluoric acid, nitric acid, hydrochloric acid, fluonitric acid, or the like can be given as an example. As the type of the acid R, fluonitric acid is particularly preferable. The time of the acid treatment can be optionally selected.

Further, if necessary, the surface 11Xa which includes the projection portions 11b may be ground and lapped before the acid treatment.

According to the configuration as described above, it is possible to provide a ceramic substrate and an electrostatic chuck device, in which the generation of particles is suppressed.

In the embodiments described above, after the base material using the dielectric material as a forming material is subjected to blasting, the surface subjected to the blasting is subjected to the heat treatment (step of performing heat treatment in the chamber for heat treatment and/or step of performing laser light irradiation), or the acid treatment. However, both the heat treatment and the acid treatment may be performed on the surface subjected to the blasting. In this way, the silicon carbide particles are more easily reduced from the surface subjected to the blasting. Further, due to the treatment of this step, the minute cracks generated in the blasting are more easily repaired. Either treatment may be performed first. However, it is preferable that the acid treatment is performed first.

Further, the two types of heat treatment may be combined, and the acid treatment may be further combined with the two types of heat treatment. In a case where two or three of the three types of treatment are combined, the order of treatment can be optionally selected. For example, it is preferable to perform the acid treatment first. It is preferable to perform the heat treatment last.

Further, in the embodiments described above, the projection portions 11b are formed on the mounting surface 11a of the mounting plate 11. However, the projection portions 11b may not be formed. That is, in the method of manufacturing an electrostatic chuck device described above, the base material using the dielectric material as a forming material may not be subjected to the blasting. Even in such an electrostatic chuck device, it is considered that the effect of suppressing the generation of particles is obtained by reducing the silicon carbide particles from the surface of the base material at the time of manufacturing.

The preferred embodiment examples of the present invention have been described above with reference to the accompanying drawings. However, it goes without saying that the present invention is not limited to such examples. The shapes, combinations, and the like of the constituent members shown in the examples described above are merely examples, and various changes can be made based on design requirements or the like within a scope which does not depart from the gist of the present invention.

EXAMPLE

Hereinafter, the present invention will be described with examples. However, the present invention is not limited to these examples.

(Number of Silicon Carbide Particles Per Unit Area)

The number of silicon carbide particles per unit area in the surface of the test piece and the cross section of the test piece was measured by cutting out a part of the test piece and observing the surface of the test piece and the cross section of the test piece with a scanning electron microscope (SEM). As the number of silicon carbide particles per unit area in the surface of the test piece and the cross section of the test piece, the average value of the measured values which are obtained with respect to 10 test pieces is adopted.

(Average Crystal Grain Size of Main Phase)

In this example, the average crystal grain size of the crystal grains configuring the sintered body was determined by the following method.

First, the surface of the sintered body was mirror-polished with a 3 μm diamond paste, and then thermal etching was performed at 1400° C. for 30 minutes in an argon atmosphere.

Subsequently, the structure of the obtained surface of the sintered body was observed at a magnification of 10,000 times by using a scanning electron microscope (model number: S-4000, manufactured by Hitachi High-Technology Corporation).

The obtained electron micrograph was incorporated into image analysis type particle size distribution measurement software (Mac-View Version 4) to calculate the major axis diameters of 200 crystal grains. The arithmetic average value of the obtained major axis diameters of the crystal grains was defined as an "average crystal grain size" to be obtained.

(Average Particle Diameter of Sub-Phase)

It was determined by a method which is the same as above except that the major axis diameters of 200 or more silicon carbide particles were used.

(Relative Density)

A test piece having a diameter of 48 mm and a thickness of 4 mm was cut out from the sintered body, and the true density (do) of this test piece was measured by the Archimedes method. Further, the theoretical density (dr) of the sintered body was obtained from the composition of the sintered body, and the ratio of the true density to the theoretical density (do/dr) was expressed as a percentage to obtain the relative density (%).

(Manufacturing of Sintered Body)

As starting materials, β-sic type silicon carbide (β-sic) particles having an average particle diameter of 0.03 μm and synthesized by thermal plasma CVD, and aluminum oxide ($Al_2O_3$) particles having an average particle diameter of 0.1 μm were used. The amount of metal impurities in the β-sic particles was 50 ppm. Further, the amount of metal impurities in the $Al_2O_3$ particles was 150 ppm.

Weighing was performed such that the β-sic particles are 8% by volume with respect to the total amount of the β-sic particles and the $Al_2O_3$ particles, and the β-sic particles and the $Al_2O_3$ particles were put in distilled water containing a dispersant. The dispersion liquid with the β-sic particles and the $Al_2O_3$ particles put therein was subjected to dispersion treatment by an ultrasonic dispersing device and then pulverized and mixed using a two-stream particle collision type pulverizing and mixing device.

The obtained mixed solution was spray-dried with a spray dryer to obtain mixed particles of β-sic and $Al_2O_3$.

The mixed particles were formed with uniaxial press at a press pressure of 8 MPa to obtain a formed body having a diameter of 320 mm and a thickness of 15 mm.

Subsequently, the formed body was heated to 500° C. under a nitrogen atmosphere without applying a press pressure thereto to remove moisture and the dispersant (contaminants). Thereafter, the formed body with the contaminants removed therefrom was heated to 400° C. in the atmosphere to oxidize the surfaces of the β-sic particles included in the formed body.

The obtained formed body was set in a graphite mold and pressure-sintering was performed. As the sintering condition, a press pressure was set to 5 MPa in a vacuum atmosphere at a temperature up to 1100° C. Thereafter, sintering was performed at a press pressure of 40 MPa and 1800° C. in an argon atmosphere to obtain a sintered body.

In the obtained sintered body, the average crystal grain size was 1.2 μm and the average particle diameter of the silicon carbide particles was 0.15 μm.

Further, the obtained sintered body had the density (relative density) of 97% or more with respect to the theoretical density of the dielectric material that is a forming material. The obtained sintered body was used in the following examples and comparative example.

Example 1

After the grinding of the surface of the sintered body, the surface was ground with a precision surface grinder (Model JK-105ATD manufactured by Kuroda Seiko Co., Ltd.) using an 800-mesh diamond grindstone.

Further, blasting was performed on the ground surface by using 400-mesh SiC abrasive grains to form a plurality of projection portions having the following conditions on the surface of the sintered body.

(Conditions)

Projection portion shape: diameter when viewed in plan view of 0.5 mm and height of 40 μm Area ratio of projection portions when viewed in a plan view: 15%

Subsequently, the blasted surface of the sintered body was annealed for 3 hours in a heating furnace set to 1300° C. to fabricate each test piece of Example 1.

On the surface of the obtained sintered body, the average value of the number of silicon carbide particles per unit area was 1.1 pieces/μm², and the average particle diameter of the silicon carbide particles was 0.06 μm.

In the cross section of the obtained sintered body, the average value of the number of silicon carbide per unit area was 3.5 pieces/μm², and the average particle diameter of the silicon carbide particles was 0.14 μm. Further, the relative density of the sintered body was 98%.

Example 2

Instead of annealing the blasted surface of the sintered body in a heating furnace, the blasted surface of the sintered body was irradiated with a pulse laser by using a laser annealing apparatus (LAEX-1000, KrF excimer laser annealing system manufactured by AOV Co., Ltd.) to fabricate each test piece of Example 2.

(Conditions)

Energy density: 200 mJ/cm²

Irradiation time: 40 minutes

Each test piece of Example 2 was fabricated in the same manner as in Example 1 except that the pulse laser irradiation was performed as described above.

On the surface of the obtained sintered body, the average value of the number of silicon carbide per unit area was 1.9 pieces/μm² and the average particle diameter of the silicon carbide particles was 0.08 μm.

In the cross section of the obtained sintered body, the average value of the number of silicon carbide per unit area was 3.6 pieces/μm² and the average particle diameter of the silicon carbide particles was 0.15 μm. Further, the relative density of the sintered body was 98%.

Example 3

Each test piece of Example 3 was fabricated in the same manner as in Example 1 except that the acid treatment was performed with fluonitric acid (50% hydrofluoric acid+50% nitric acid), instead of annealing the blasted surface of the sintered body in a heating furnace.

On the surface of the obtained sintered body, the silicon carbide particles were very small and could not be measured.

In the cross section of the obtained sintered body, the average value of the number of silicon carbide per unit area was 3.6 pieces/μm² and the average particle diameter of the silicon carbide particles was 0.15 μm. Further, the relative density of the sintered body was 98%.

Comparative Example 1

A test piece of Comparative Example 1 was fabricated in the same manner as in Example 1 except that the blasted surface of the sintered body was not annealed in a heating furnace.

On the surface of the obtained sintered body, the average value of the number of silicon carbide per unit area was 3.6 pieces/μm² and the average particle diameter of the silicon carbide particles was 0.16 μm.

In the cross section of the obtained sintered body, the average value of the number of silicon carbide per unit area was 3.6 pieces/μm² and the average particle diameter of the silicon carbide particles was 0.15 μm. Further, the relative density of the sintered body was 98%.

[Evaluation]

The following evaluations were performed on the respective test pieces of Example 1 and Comparative Example 1.

(Particle Evaluation)

Figure 5:
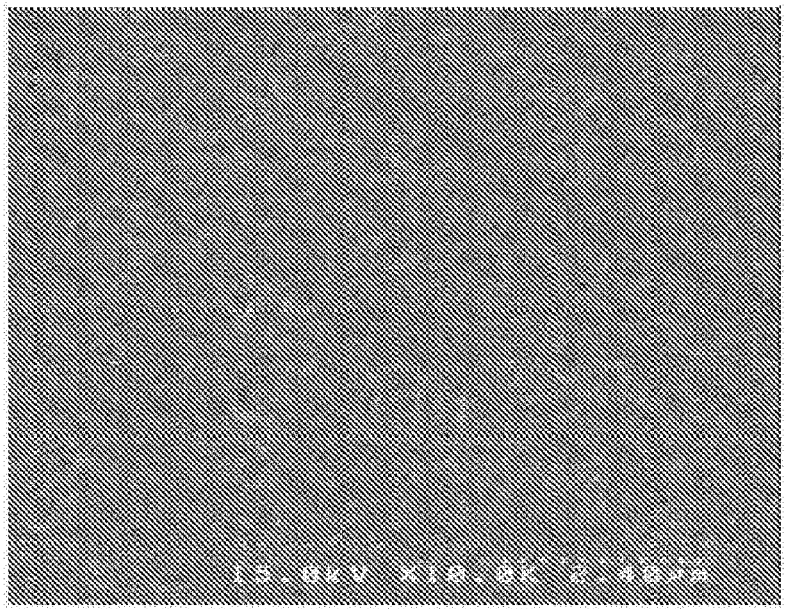
FIG. 5 is an SEM image of the surface of a test piece of Example 1.
Figure 6:
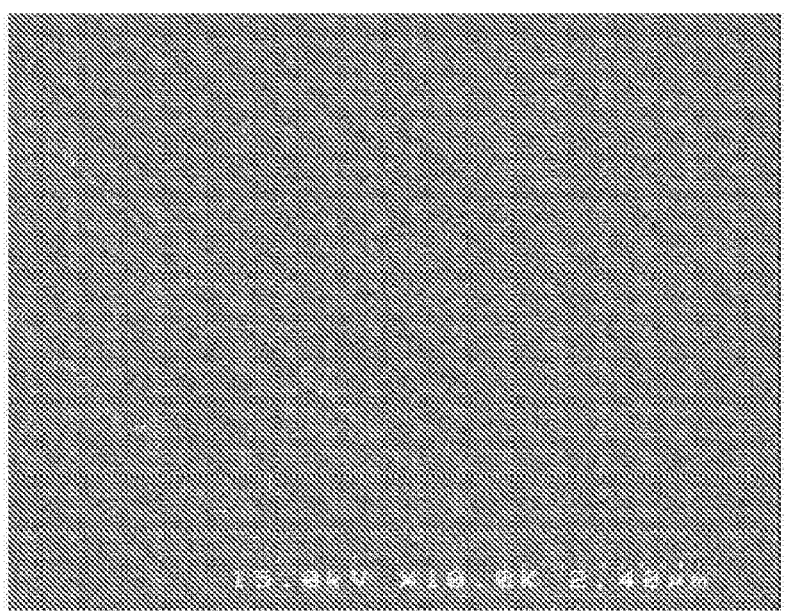
FIG. 6 is an SEM image of the surface of a test piece of Comparative Example 1.

The surface of each of the test pieces of Example 1 and Comparative Example 1 was imaged using an SEM and the surface state of each test piece was confirmed. FIG. 5 is an SEM image of the surface of the test piece of Example 1. FIG. 6 is an SEM image of the surface of the test piece of Comparative Example 1.

(Relative Dielectric Constant, Dielectric Loss Tangent, Leakage Current of Test Piece)

In this example, relative dielectric constant and dielectric loss tangent were measured by the parallel plate method using a precision impedance analyzer (model number: 4294A, manufactured by Agilent Technologies) and a dielectric test fixture (model number: 16451B, manufactured by Agilent Technologies).

A voltage having a maximum value of 20 kV was applied between two electrodes while increasing the voltage in stages by 1 kV from 1 kV, and the leakage current at each voltage was measured.

Figure 7:
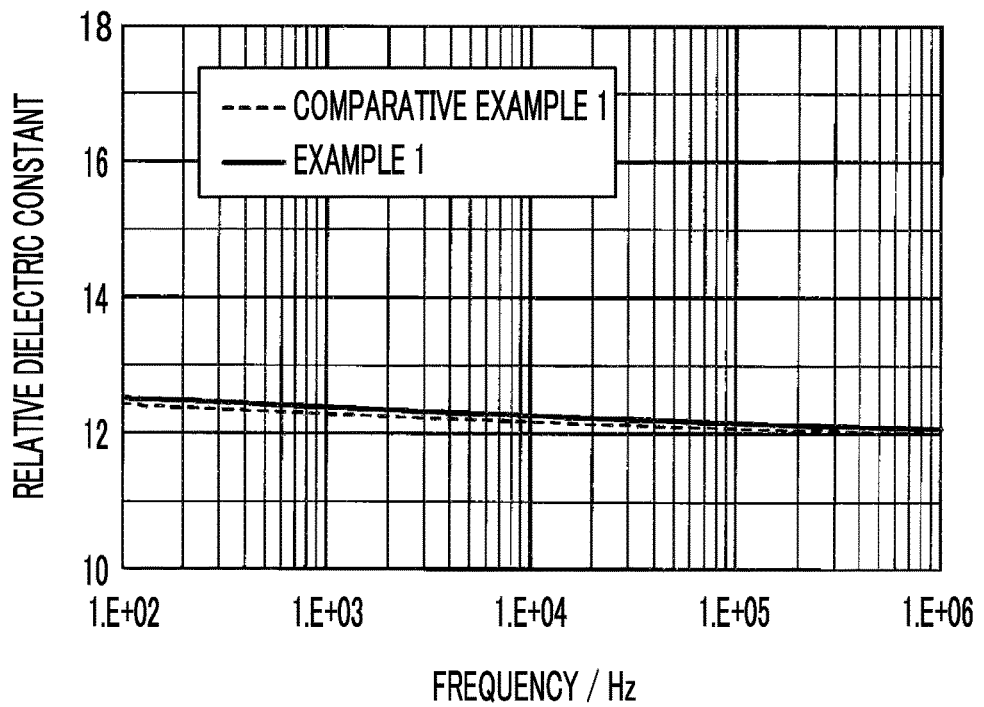
FIG. 7 is a graph comparing relative dielectric constants of the respective test pieces of Example 1 and Comparative Example 1.
Figure 8:
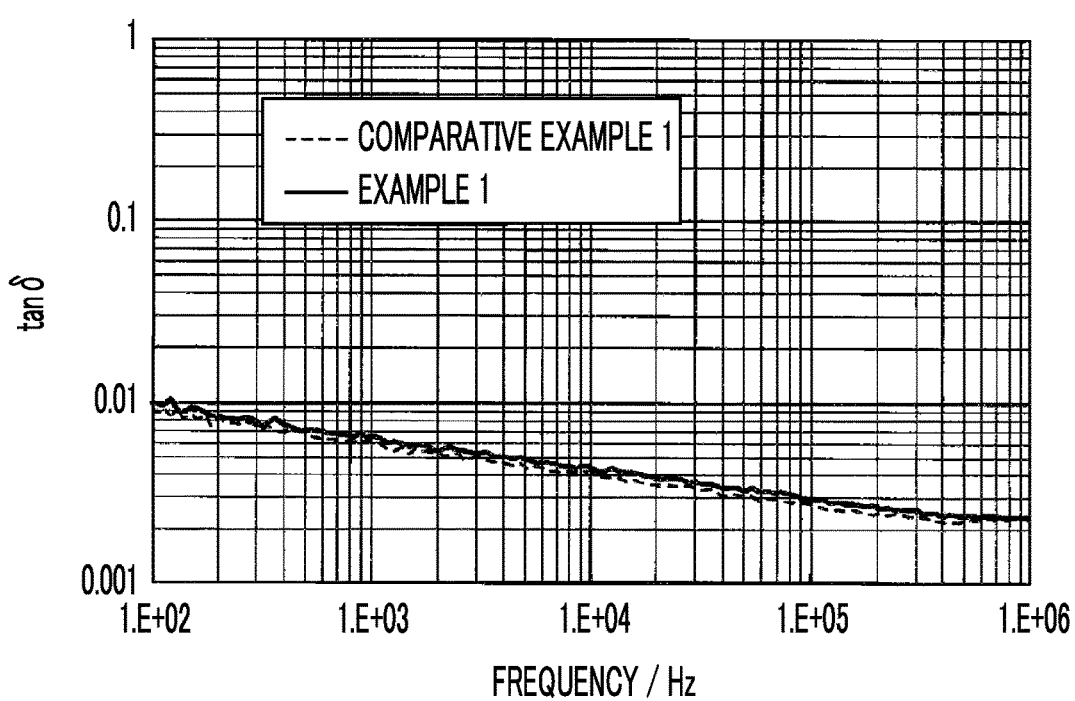
FIG. 8 is a graph comparing complex dielectric constants of the respective test pieces of Example 1 and Comparative Example 1.
Figure 9:
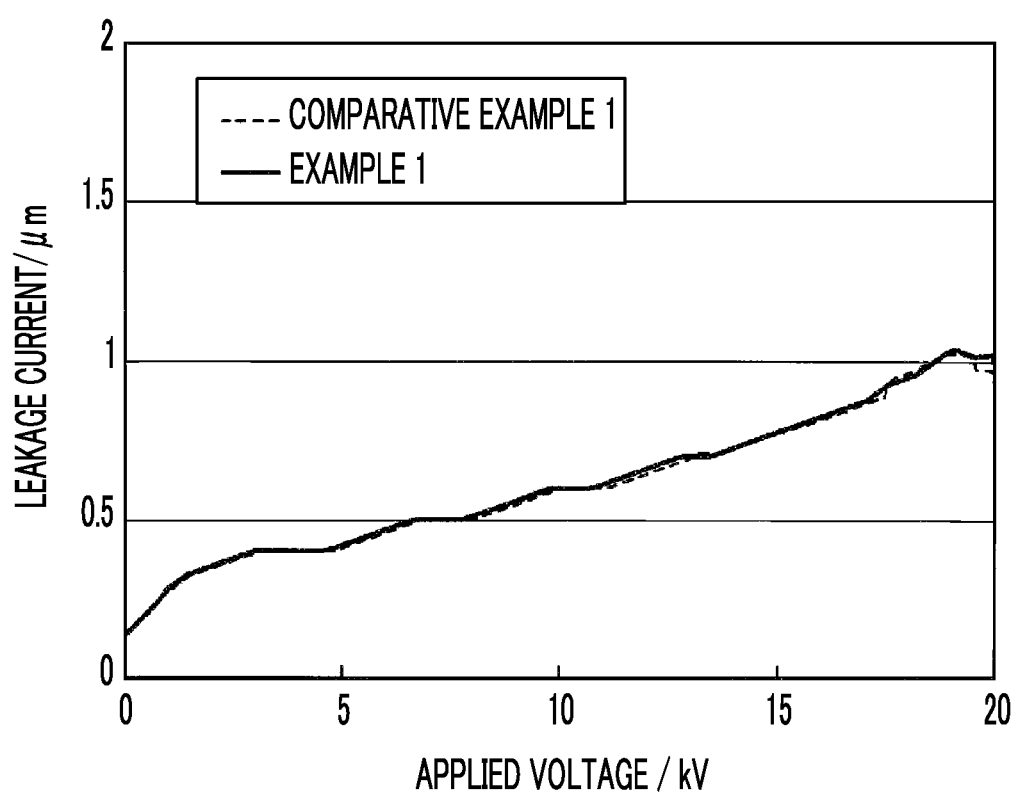
FIG. 9 is a graph comparing leakage currents of the respective test pieces of Example 1 and Comparative Example 1.

FIG. 7 is a graph comparing the relative dielectric constants of the respective test pieces of Example 1 and Comparative Example 1. FIG. 8 is a graph comparing the complex dielectric constants of the respective test pieces of Example 1 and Comparative Example 1. FIG. 9 is a graph comparing the leakage currents of the respective test pieces of Example 1 and Comparative Example 1.

As shown in FIGS. 5 and 6, irregularities were observed on the surface of the test piece of Example 1 as compared with the surface of the test piece of Comparative Example 1. From this, it is considered that the silicon carbide particles on the surface, which serve as one of the causes of particle generation, are desorbed from the test piece of Example 1. From these results, it is considered that in the test piece of Example 1, the generation of particles which are caused by the silicon carbide particles is suppressed as compared with the test piece of Comparative Example 1.

As shown in FIGS. 7 to 9, it was found that the electrical characteristics (relative dielectric constant, complex dielectric constant, leakage current) of the respective test pieces of Example 1 and Comparative Example 1 were equivalent.

Therefore, it is considered that in the test piece of Example 1 to which the present invention is applied, the generation of particles is suppressed while maintaining the electrical characteristics.

From the above results, it was found that the present invention is useful.

INDUSTRIAL APPLICABILITY

Provided is a ceramic substrate in which generation of particles is suppressed.

REFERENCE SIGNS LIST

1: electrostatic chuck device
2: electrostatic chuck part
2X: original substrate
2Y: temporary electrostatic chuck part
3: temperature adjusting base part
3A: flow path
3*b*: through-hole
4: adhesion layer
5: heater element
6: adhesion layer
7: insulating plate
8: adhesive layer
10: focus ring 11: mounting plate
11a: mounting surface
11b: projection portion
11X: base material
11Xa: surface of base material
12: supporting plate
13: electrostatic attraction electrode
14: insulating material layer
15: power supply terminal
15a: insulator
16: through-hole
17: power supply terminal
18: tubular insulator
19: groove
20: temperature sensor
21: installation hole
22: temperature measurement part
23: excitation unit
24: fluorescence detector
25: control unit
28: gas hole
29: Insulator
111: temporary substrate
112: temporary projection portion
112x: top surface
1000: chamber
1100: single-sided lapping machine
A: ceramic abrasive grain
R: acid
L: Laser light
W: plate-shaped sample
α: portion

The invention claimed is:

1. A ceramic substrate which is made of a dielectric material including silicon carbide particles as a forming material,
wherein the number of the silicon carbide particles per unit area on a surface of the substrate is smaller than the number of the silicon carbide particles per unit area in a cross section of the substrate, and
a unit of the number of the silicon carbide particles per unit area is shown by pieces/$\mu m^2$.

2. The ceramic substrate according to claim 1, wherein an average particle diameter of the silicon carbide particles is 0.2 μm or less.

3. A susceptor comprising:
the ceramic substrate according to claim 1,
wherein a surface of the ceramic substrate is a mounting surface on which a plate-shaped sample is mounted.

4. An electrostatic chuck device comprising:
an electrostatic chuck part which includes
the ceramic substrate according to claim 1 as a mounting plate,
a supporting plate,
an electrostatic attraction electrode provided between the ceramic substrate and the supporting plate, and
an insulating material layer that insulates surroundings of the electrostatic attraction electrode;
a temperature adjusting base part; and
an adhesive layer provided between the electrostatic chuck part and the temperature adjusting base part.

5. The ceramic substrate according to claim 1, wherein the dielectric material includes
aluminum oxide particles or yttrium oxide particles having an average crystal grain size of 5 μm or less, as a main phase, and
silicon carbide particles having an average particle diameter of 0.2 μm or less, as a sub-phase.

6. The ceramic substrate according to claim 1, wherein the ceramic substrate is formed by a method including:
a first step of forming a plurality of projection portions by performing blasting on a base material made of a composite sintered body which includes aluminum oxide particles or yttrium oxide particles as a main phase and silicon carbide particles as a sub-phase; and
a second step including at least one sub-step of following (a) to (c), which is performed after the step of forming the projection portions;
(a) a step of heat-treating the base material at a temperature of 900° C. or higher and 1300° C. or lower in a chamber for treatment,
(b) a step of performing heat treatment by irradiating a surface of the base material on which the projection portions have been formed, with laser light, and
(c) a step of acid-treating a surface of the base material on which the projection portions are formed.

7. The ceramic substrate according to claim 6, wherein the method further includes, before the first step, a step of adding a supporting plate which supports a bottom portion side of the base material, an electrostatic attraction electrode which is provided between the base material and the supporting plate, and an insulating material layer which insulates surroundings of the electrostatic attraction electrode, to the base material.

8. The ceramic substrate according to claim 1, wherein the cross section is generated by cutting out a part of the ceramic substrate.

9. The ceramic substrate according to claim 1, wherein the ceramic substrate includes
at least one of aluminum oxide particles and yttrium oxide particles as a main phase and
silicon carbide particles as a sub-phase.

* * * * *